(12) United States Patent
Park (10) Patent No.: US 10,937,756 B2
(45) Date of Patent: Mar. 2, 2021

(54) METHOD OF ALIGNING WAFERS, METHOD OF BONDING WAFERS USING THE SAME, AND APPARATUS FOR PERFORMING THE SAME

(71) Applicant: SAMSUNG ELECTRONICS CO., LTD., Suwon-si (KR)

(72) Inventor: Hyun-Mog Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/402,747

(22) Filed: May 3, 2019

(65) Prior Publication Data

US 2020/0118964 A1 Apr. 16, 2020

(30) Foreign Application Priority Data

Oct. 11, 2018 (KR) .......................... 10-2018-0121028

(51) Int. Cl.
| | |
|---|---|
| H01L 21/00 | (2006.01) |
| H01L 23/00 | (2006.01) |
| H01L 23/544 | (2006.01) |
| H01L 21/67 | (2006.01) |
| H01L 21/68 | (2006.01) |
| H01L 21/306 | (2006.01) |
| H01L 21/268 | (2006.01) |

(52) U.S. Cl.
CPC ........ H01L 24/80 (2013.01); H01L 21/67075 (2013.01); H01L 21/67115 (2013.01); H01L 21/681 (2013.01); H01L 23/544 (2013.01); H01L 24/94 (2013.01); H01L 21/268 (2013.01); H01L 21/30604 (2013.01); H01L 2223/54426 (2013.01); H01L 2224/8013 (2013.01)

(58) Field of Classification Search
CPC ............... H01L 24/80; H01L 21/67075; H01L 21/67115; H01L 21/681; H01L 23/544; H01L 24/94; H01L 21/268; H01L 21/30604; H01L 2223/54426
See application file for complete search history.

(56) References Cited

U.S. PATENT DOCUMENTS

| | | | |
|---|---|---|---|
| 6,085,967 A | 7/2000 | Grande et al. | |
| 6,967,145 B2 | 11/2005 | Tseng et al. | |
| 7,562,686 B2 | 7/2009 | Best et al. | |

(Continued)

FOREIGN PATENT DOCUMENTS

| | | |
|---|---|---|
| KR | 10-2009-0047598 A | 5/2009 |
| KR | 10-2009-0051929 A | 5/2009 |

(Continued)

*Primary Examiner* — Richard A Booth
(74) *Attorney, Agent, or Firm* — Lee IP Law, P.C.

(57) ABSTRACT

In a method of aligning wafers, a second wafer having at least one second alignment key may be arranged over a first wafer having at least one first alignment key. At least one alignment hole may be formed by passing through the second wafer to expose the second alignment key and the first alignment key. The first wafer and the second wafer may be aligned with each other using the first alignment key and the second alignment key exposed through the alignment hole. Thus, the first alignment key and the second alignment key exposed through the alignment hole may be positioned at a same vertical line to accurately align the first wafer with the second wafer.

11 Claims, 11 Drawing Sheets

(56) References Cited

U.S. PATENT DOCUMENTS

| | | | |
|---|---|---|---|
| 8,227,899 B2 | 7/2012 | Liu et al. | |
| 8,299,584 B2 | 10/2012 | Shneyder et al. | |
| 8,399,940 B2 | 3/2013 | Lin et al. | |
| 8,877,637 B2 | 11/2014 | Yu et al. | |
| 9,012,265 B2 | 4/2015 | Yi et al. | |
| 2013/0147021 A1* | 6/2013 | Puurunen | H01L 29/02 257/635 |
| 2013/0273740 A1* | 10/2013 | Chang | G03F 7/20 438/694 |
| 2014/0370624 A1 | 12/2014 | Farooq et al. | |

FOREIGN PATENT DOCUMENTS

| | | |
|---|---|---|
| KR | 10-2009-0112504 A | 10/2009 |
| KR | 10-2012-0098012 A | 9/2012 |

\* cited by examiner

METHOD OF ALIGNING WAFERS, METHOD OF BONDING WAFERS USING THE SAME, AND APPARATUS FOR PERFORMING THE SAME

CROSS-RELATED TO RELATED APPLICATION

Korean Patent Application No. 2018-0121028, filed on Oct. 11, 2018 in the Korean Intellectual Property Office (KIPO), and entitled: "Method of Aligning Wafers, Method of Bonding Wafers Using the Same, and Apparatus for Performing the Same," is incorporated by reference herein in its entirety.

BACKGROUND

1. Field

Example embodiments relate to a method of aligning wafers, a method of bonding wafers using the same, and an apparatus for performing the same. More particularly, example embodiments relate to an aligning method of aligning at least two wafers using alignment keys, a bonding method of bonding the two wafers using the aligning method, and an apparatus for performing the aligning method and the bonding method.

2. Description of the Related Art

Generally, when wafers may be bonded together, it may be required to accurately align the wafers. The wafers may be aligned with each other using alignment keys. The alignment keys may be provided to each of the wafers.

When wafers may be aligned using a mechanical alignment apparatus, the wafers may not be accurately aligned using the mechanical alignment apparatus due to a low accuracy of the mechanical alignment apparatus. An optical alignment apparatus may have a higher accuracy than the mechanical alignment apparatus. However, when wafers may be aligned using the optical alignment apparatus, the wafers may be misaligned with each other. For example, the optical alignment apparatus may include two cameras for photographing alignment keys in the wafers. The wafers may not be accurately aligned with each other due to errors of the images.

SUMMARY

Embodiments are directed to a method of aligning wafers including: arranging a second wafer having at least one second alignment key over a first wafer having at least one first alignment key; forming at least one alignment hole by passing through the second wafer to expose the second alignment key and the first alignment key; and aligning the first wafer and the second wafer with each other using the first alignment key and the second alignment key exposed through the alignment hole.

Embodiments are directed to a method of bonding wafers including: arranging a second wafer having at least one second alignment key over a first wafer having at least one first alignment key; forming at least one alignment hole by passing through the second wafer to expose the second alignment key and the first alignment key; aligning the first wafer and the second wafer with each other using the first alignment key and the second alignment key exposed through the alignment hole; and bonding the first wafer and the second wafer to each other.

Embodiments are directed to an apparatus for of aligning wafers including: a piercer to form at least one alignment hole by passing through a second wafer to expose a second alignment key of the second wafer and a first alignment key of a first wafer; a camera to photograph the first and second alignment keys through the alignment hole to obtain an image of the first and second alignment keys; and an actuator to move the first wafer and/or the second wafer to align the first alignment key and the second alignment key with each other using the image.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

FIGS. 1 to 10 are cross-sectional views and plan views of wafers of stages in illustrating a method of bonding the wafers to each other in accordance with example embodiments.

Figure 1:
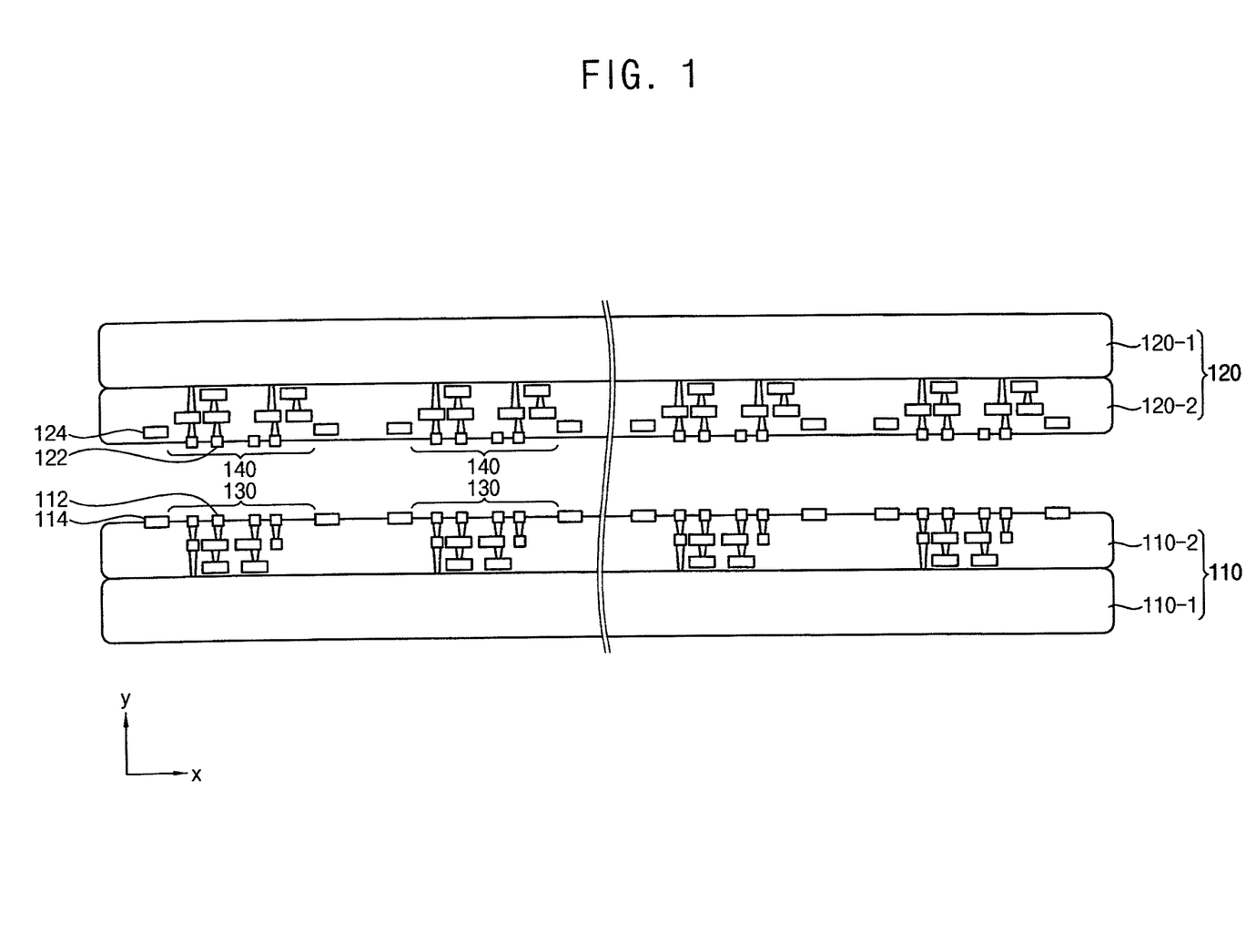
FIGS. 1 to 10 illustrate cross-sectional views and plan views of stages in a method of bonding a first wafer to a second wafer in accordance with example embodiments.

Referring to FIG. 1, a first wafer 110 may include a first substrate 110_1 and a first insulation structure 110_2 that may be stacked in a Y direction. The first insulation structure 110_2 may include a plurality of first semiconductor chips 130. Each of the first semiconductor chips 130 may include first bonding pads 112. The first bonding pads 112 may be arranged on an upper surface of the first insulation structure 110_2 of the first wafer 110. For example, the upper surface of the first insulation structure 110_2 of the first wafer 110 may be an active area or an active surface. Each of the first semiconductor chips 130 may include at least one first alignment key 114. The first alignment key 114 may be arranged around the first bonding pads 112. For example, the first alignment key 114 may be arranged on an edge portion of the first semiconductor chip 130. The first alignment key 114 may have a rectangular cross-sectional shape. For example, the first alignment key 114 may have side surfaces that are adjacent to the upper surface of the first insulation structure 110_2 in an X direction. In another embodiment, the first alignment key 114 may have various cross-sectional shapes.

In example embodiments, the first insulation structure 110_2 may include an opaque insulation material. In this case, the first alignment key 114 may be exposed outside the upper surface of the first insulation structure 110_2 in order to recognize the first alignment key 114 by a camera. Alternatively, when the first insulation structure may include a transparent material, the first alignment key 114 may not be exposed and may be arranged inside the first insulation structure 110_2.

The second wafer 120 may be arranged over the first wafer 110. The second wafer 120 may include a second insulation structure 120_2 and a second substrate 120_1 that may be stacked in the Y direction. The second wafer 120 may include a plurality of second semiconductor chips 140 in the second insulation structure 120_2. Each of the second semiconductor chips 140 may include second bonding pads 122. The second bonding pads 122 may be arranged on a lower surface of the second insulation structure 120_2 of the second wafer 120. For example, the lower surface of the second insulation structure 120_2 may be an active area or an active surface. Each of the second semiconductor chips 140 may include at least one second alignment key 124. The second alignment key 124 may be arranged around the second bonding pads 122. For example, the second alignment key 124 may be arranged on an edge portion of the second semiconductor chip 140. The second alignment key 124 may have a shape substantially the same as that of the first alignment key 114. The second alignment key 124 may have a rectangular cross-sectional shape. In another embodiment, the second alignment key 124 may have various cross-sectional shapes.

In example embodiments, the second insulation structure 120_2 may include an opaque insulation material. In this case, the second alignment key 124 may be exposed outside the lower surface of the second insulation structure 120_2 in order to recognize the second alignment key 124 by the camera. Alternatively, when the second insulation structure 120_2 may include a transparent material, the second alignment key 124 may not be exposed and may be arranged inside the second insulation structure 120_2.

Figure 2:
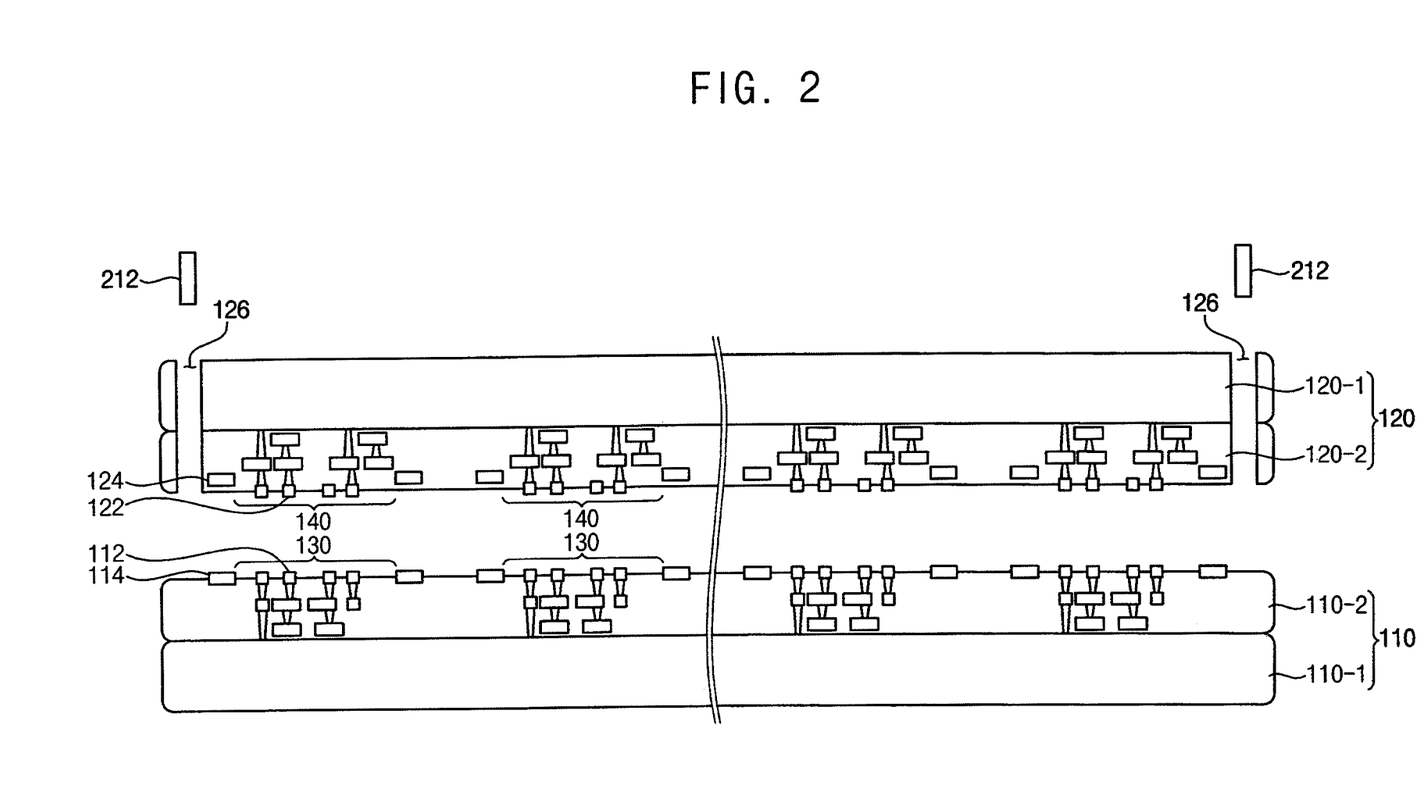

Referring to FIG. 2, at least one preliminary alignment hole 126 may be formed by passing through the second wafer 120. The preliminary alignment hole 126 may be vertically formed by passing through an edge portion of the second wafer 120 adjacent to the second alignment key 124. For example, the preliminary alignment hole 126 may pass through the second substrate 120_1 and the second insulation structure 120_2 in the Y direction. The preliminary alignment hole 126 may extend from the lower surface of the second insulation structure 120_2 to an upper surface of the second substrate 120_1. Because the preliminary alignment hole 126 may be vertically formed by passing through the second wafer 120, the first alignment key 114 of the first wafer 110 may be exposed through the preliminary alignment hole 126 of the second wafer 120. For example, an upper surface of the first alignment key 114 of the first wafer 110 may be exposed through the preliminary alignment hole 126 of the second wafer 120. However, because the preliminary alignment hole 126 of the second wafer 120 may be adjacent to the second alignment key 124 of the second wafer in the X direction, a side surface of the second alignment key 124 of the second wafer 120 may be arranged adjacent to an inner surface of the preliminary alignment hole 126 of the second wafer 120. For example, the side surface of the second alignment key 124 of the second wafer 120 may not exposed outside the second insulation structure 120_2. For example, the preliminary alignment hole 126 of the second wafer 120 may not overlap the first alignment key 114 of the first wafer 110 in the Y direction. Alternatively, the preliminary alignment hole 126 of the second wafer 120 may be formed on a scribe line between the second semiconductor chips 140.

In example embodiments, the preliminary alignment hole 126 of the second wafer 120 may be formed using a laser drill 212. For example, referring to FIG. 11, the second wafer 120 may be loaded into a piercer 210. The laser drill 212 in the piercer 210 may form the preliminary alignment hole 126 by passing through the second wafer 120.

Figure 3:
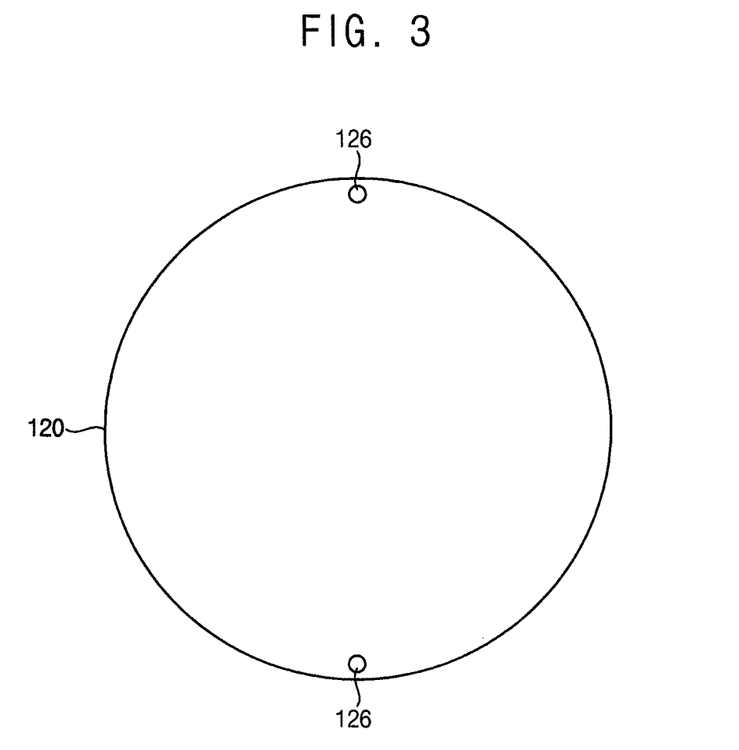

Referring to FIG. 3, the preliminary alignment hole 126 of the second wafer 120 may include two holes arranged at edge portions of the second wafer 120. Alternatively, the preliminary alignment hole 126 of the second wafer 120 may include one hole, at least three holes, or more holes. For example, gaps between the preliminary alignment holes 126 may be uniform or different from each other.

Figure 4:
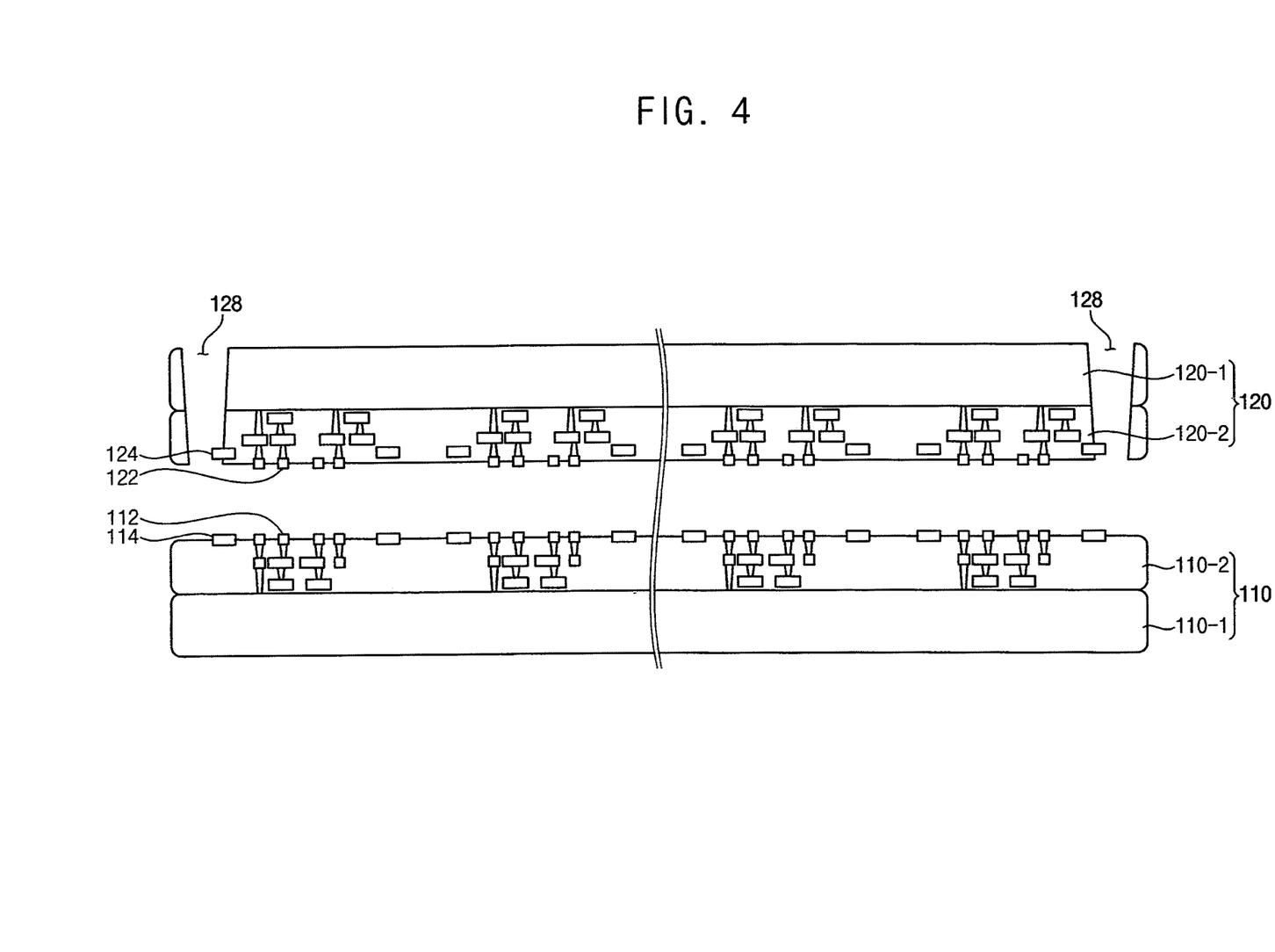
Figure 5:
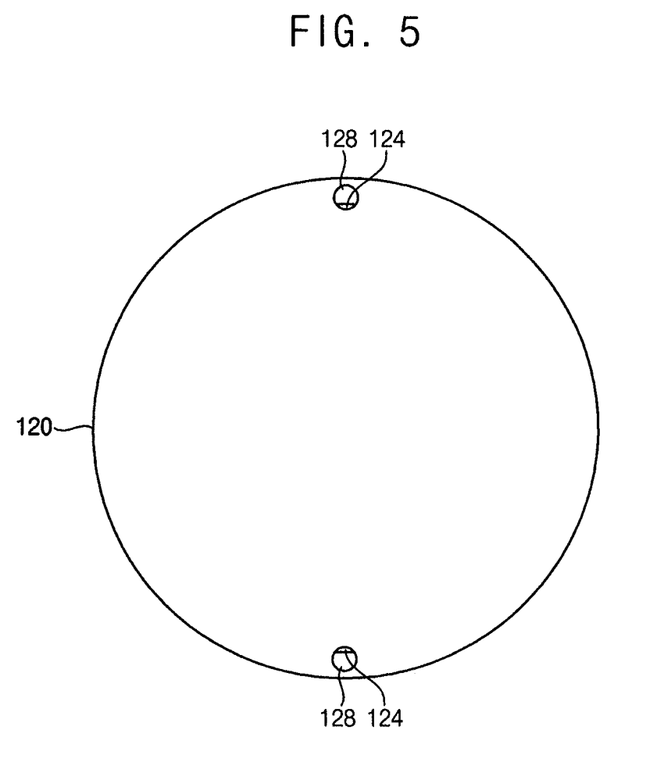

Referring to FIGS. 4 and 5, a width (or diameter) of the preliminary alignment hole 126 of the second wafer 120 may be expanded or increased to form an alignment hole 128. The alignment hole 128 may have a closed-loop shape, e.g., a circle, a rectangular, or any polygon. For example, as the alignment hole 128 may extend in the Y direction (i.e., a direction from the lower surface to the upper surface of the second wafer 120), the width (or diameter) of the alignment hole 128 may be gradually increased. For example, an upper surface and the side surface of the second alignment key 124 may be exposed through the alignment hole 128 of the second wafer 120. In example embodiments, the upper surface of the second alignment key 124 may be wholly or partially exposed through the alignment hole 128 of the second wafer 120. Thus, the upper surface and the side surface of the first alignment key 114 of the first wafer 110 and the upper surface and the side surface of the second alignment key 124 of the second wafer 120 may be exposed through the alignment hole 128. Further, a bottom surface of the second alignment key 124 of the second wafer 120 may be wholly or partially exposed through the alignment hole 128. For example, the alignment hole 128 of the second wafer 120 may overlap the upper surface and the side surface of the first alignment key 114 in the Y direction when the first and second wafers 110 and 120 may be aligned with each other.

Figure 11:
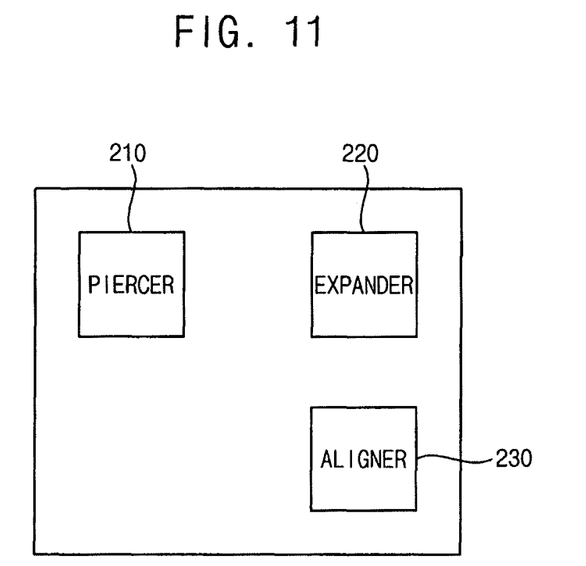
FIG. 11 illustrates an apparatus for aligning the first and second wafers with each other in FIG. 1.

In example embodiments, referring to FIG. 11, the width (or diameter) of the preliminary alignment hole 126 may be expanded or increased using an expander 220. The expander 220 may include a wet etcher. The wet etcher may apply a wet etching solution to an inner surface of the preliminary alignment hole 126 to expand the width (or diameter) of the preliminary alignment hole 126. The application of the wet etching solution may include injecting the wet etching solution to the preliminary alignment hole 126 and dipping the second wafer 120 in a wet etching bath in which the wet etching solution may be reserved. The wet etching solution may include KOH, TMAH, etc.

Figure 6:
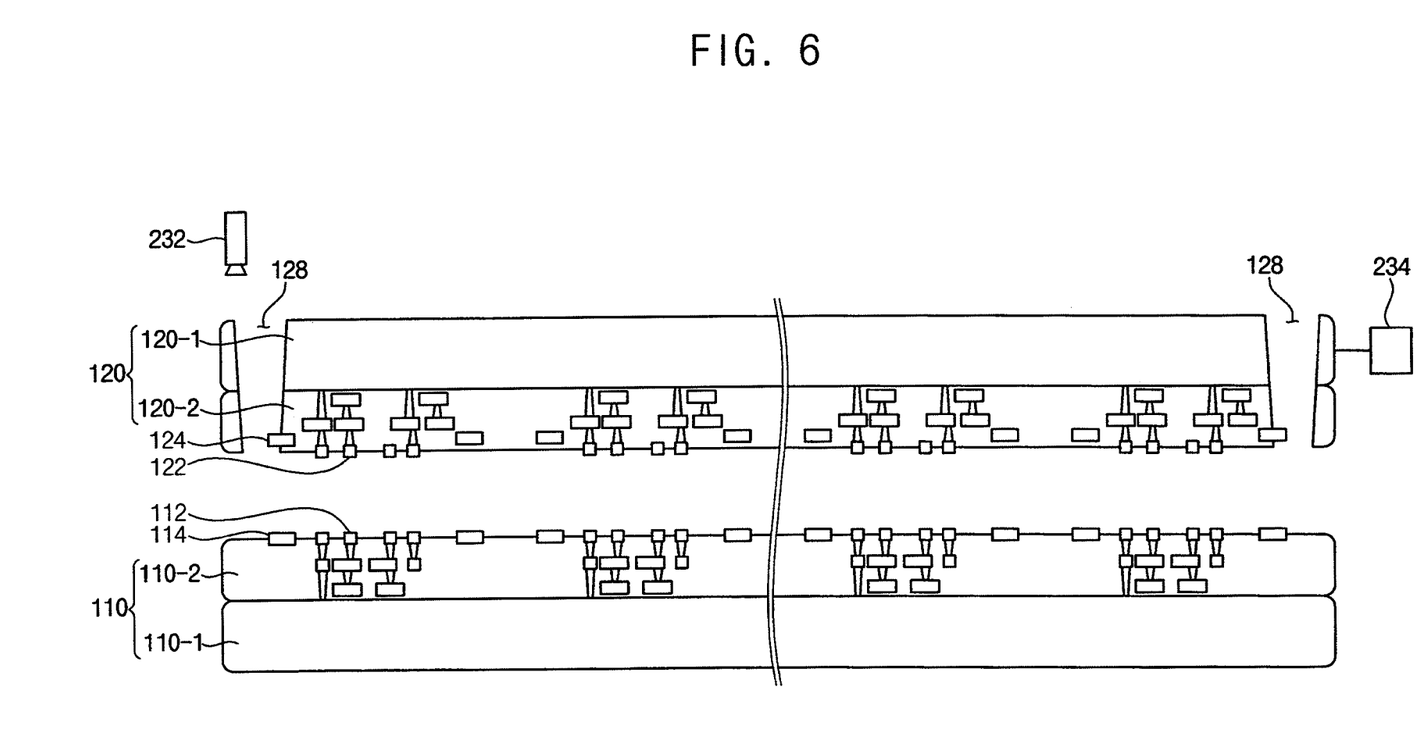

Referring to FIG. 6, a camera 232, which may be arranged over the second wafer 120, may photograph the first alignment key 114 of the first wafer 110 and the second alignment key 124 of the second wafer 120 that may be exposed through the alignment hole 128 of the second wafer 120. For example, the first alignment key 114 of the first wafer 110 and the second alignment key 124 of the second wafer 120 may be exposed through one alignment hole 128, and the first alignment key 114 of the first wafer 110 and the second alignment key 124 of the second wafer 120 may be photographed using only one camera 232.

An actuator 234 may move the second wafer 120 to position the side surfaces of the first and second alignment keys 114 and 124 at a same vertical line based on images of the first and second alignment keys 114 and 124 that are obtained by the camera 232. When the side surfaces of the first and second alignment keys 114 and 124 may be located at the vertical line, the first bonding pad 112 and the second bonding pad 122 may be aligned with each other. For example, the actuator 234 may adjust a location of the second wafer 120 to align the side surface of the first alignment key 114 with the side surface of the second alignment key 124 in the Y direction such that the first bonding pad 112 and the second bonding pad 122 may be aligned with each other.

In example embodiments, the actuator 234 may move only the second wafer 120. Alternatively, the actuator 234 may move only the first wafer 110. Further, the actuator 234 may move both the first and second wafers 110 and 120. The actuator 234 may include a servo motor.

Figure 7:
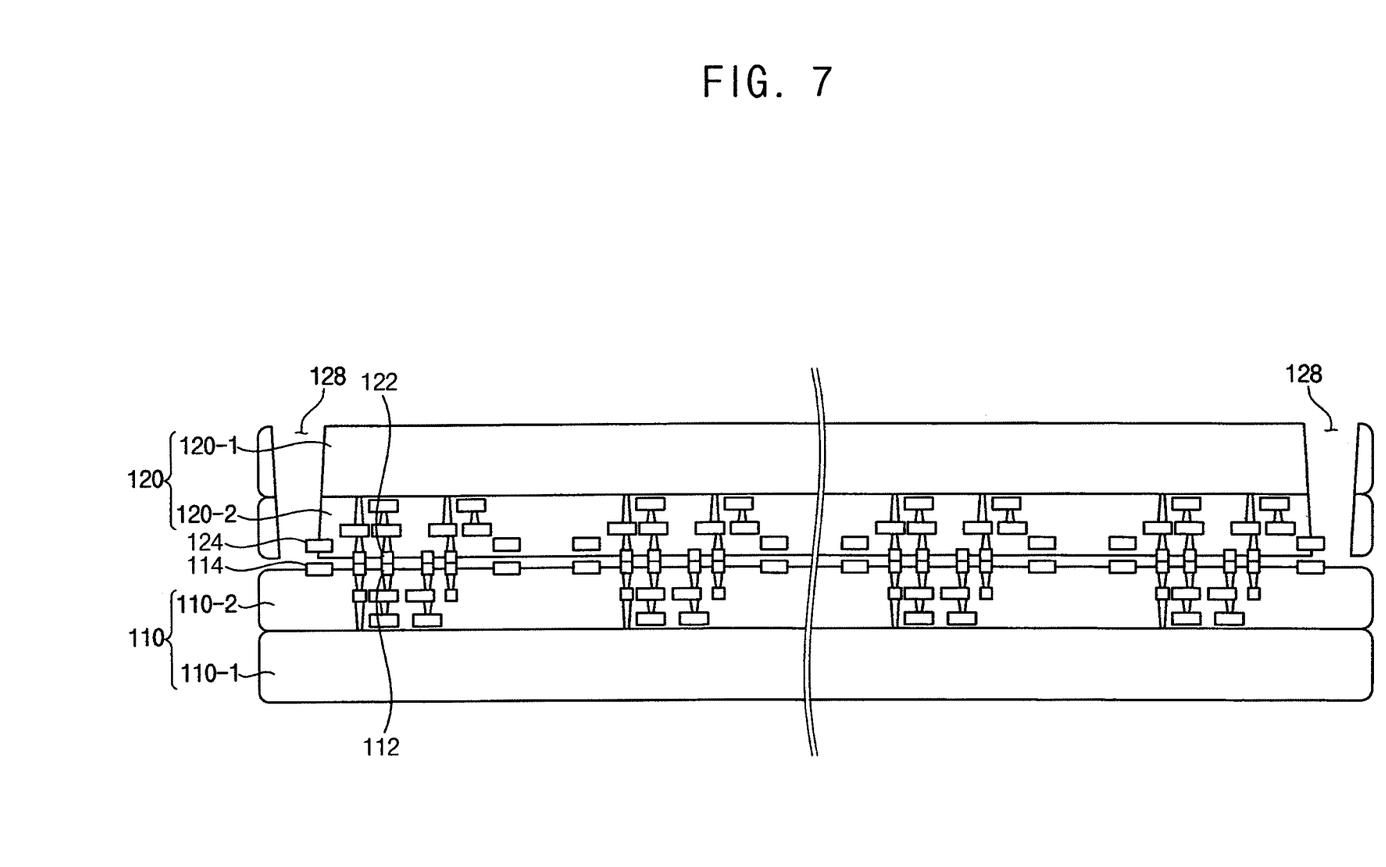

Referring to FIG. 7, the first wafer 110 and the second wafer 120 may be bonded to each other after the first wafer 110 and the second wafer 120 are aligned with each other. For example, because the first alignment key 114 and the second alignment key 124 may be accurately aligned with each other at a vertical line, the first bonding pad 112 and the second bonding pad 122 may also be accurately aligned with each other and may be precisely connected with each other.

Figure 8:
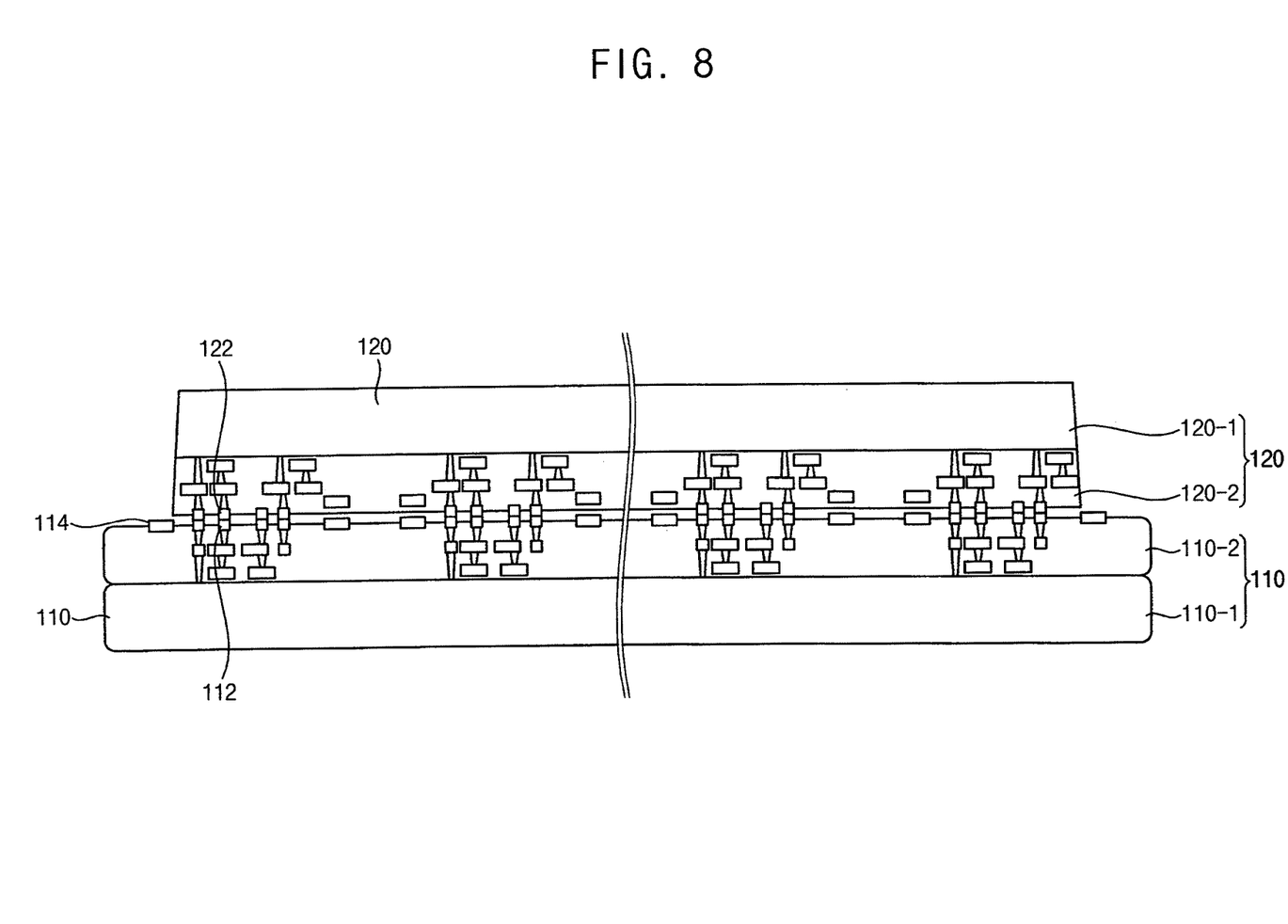
Figure 9:
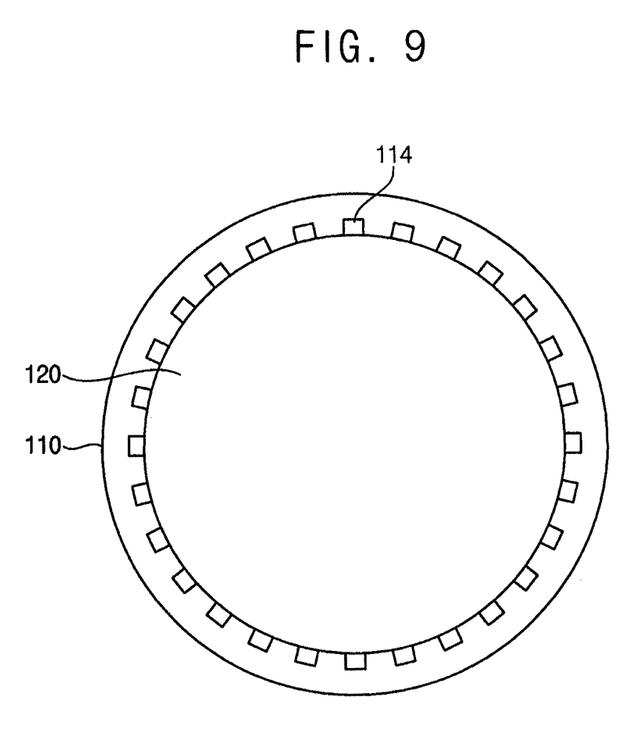

Referring to FIGS. 8 and 9, the edge portion of the second wafer 120, at which the alignment hole 128 may be positioned, may be removed. For example, the second alignment key 124 of the second wafer 120 may be removed by removing the edge portion of the second wafer 120. Further, the alignment hole 128 of the second wafer 120 may be removed. For example, an upper edge surface of the first wafer 110 and the upper surface of the first alignment key 114 may also be exposed. For example, the second wafer 120 may not cover the upper edge surface of the first wafer 110 and the upper surface of the first alignment key 114 of the first wafer 110.

Figure 10:
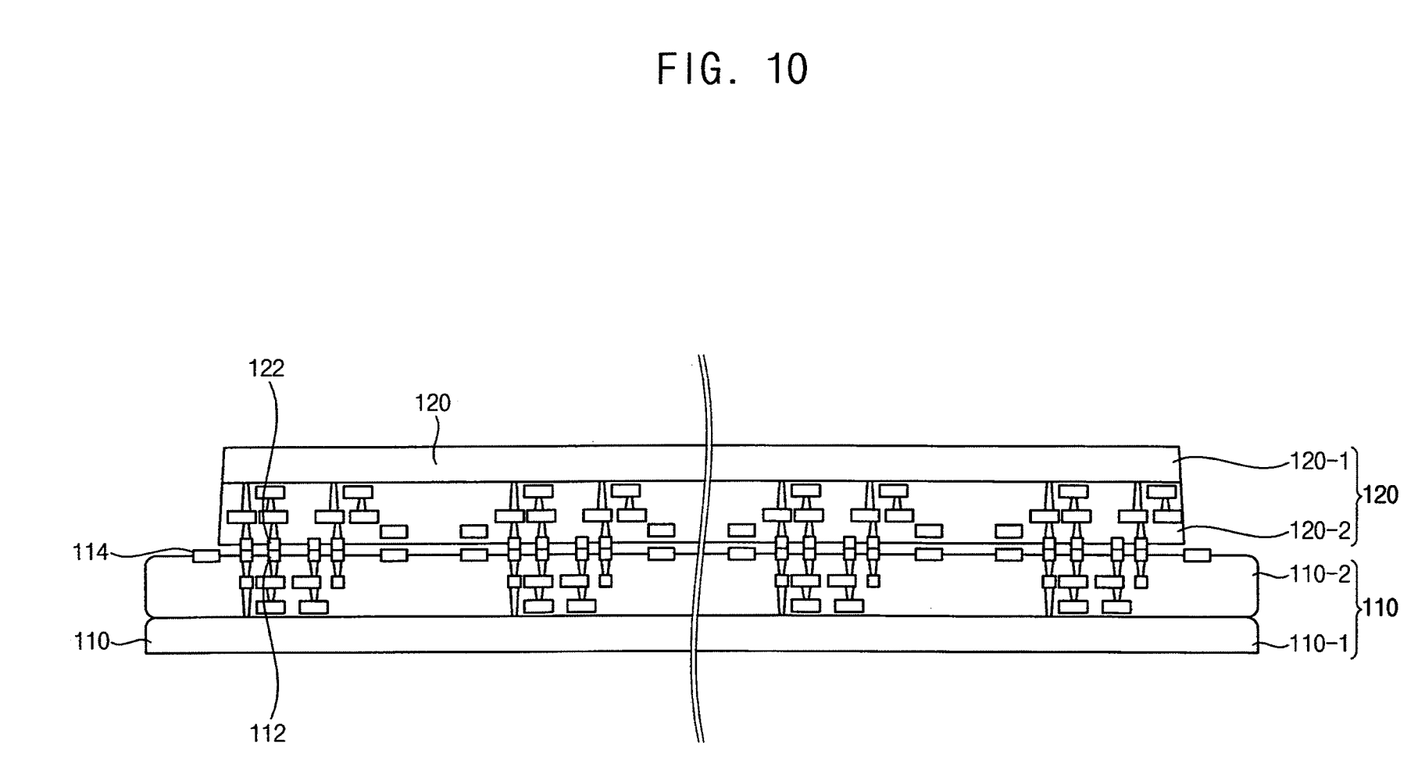

Referring to FIG. 10, in order to reduce a thickness of each of stack packages (or in order to minimize a thickness of the bonded first and second wafers 110 and 120), backsides of the first and second wafers 110 and 120 may be partially removed. The scribe lanes of the first and second wafers 110 and 120 may be cut to form the stack packages. For example, each of the stack packages may include each first semiconductor chip 130 and each second semiconductor chip 140 that may be bonded together.

Referring to FIG. 11, an apparatus for aligning the first and second wafers 110 and 120 may include the piercer 210, the expander 220, and an aligner 230. The aligner 230 may include the camera 232 and the actuator 234. The piercer 210, the expander 220, and the aligner 230 may be arranged in one system. In this case, the piercer 210, the expander 220, and the aligner 230 in one system may be used only for aligning the wafers 110 and 120. The bonding process of the first and second wafers 110 and 120 illustrated with reference to FIG. 7 may be performed by the aligner 230.

According to example embodiments, a second alignment key of a second wafer and a first alignment key of a first wafer may be simultaneously exposed through at least one alignment hole formed by passing through the second wafer. Thus, the first alignment key and the second alignment key exposed through the at least one alignment hole may be positioned at one vertical line to accurately align the first wafer with the second wafer. The first and second wafers may be bonded together with accurate and precise alignment. As a result, reliability of electrical connections of pads of the first and second wafers bonded to each other may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of aligning wafers, the method comprising:
    arranging a second wafer having at least one second alignment key over a first wafer having at least one first alignment key;
    forming at least one alignment hole by passing through the second wafer to expose the second alignment key and the first alignment key; and
    aligning the first wafer and the second wafer with each other using the first alignment key and the second alignment key exposed through the alignment hole,
    wherein forming the alignment hole comprises:
    forming a preliminary alignment hole by passing through the second wafer to expose a side surface of the second alignment key and an upper surface of the first alignment key; and
    expanding a width of the preliminary alignment hole to form the alignment hole to expose an upper surface of the second alignment key.

2. The method as claimed in claim 1, wherein forming the preliminary alignment hole includes drilling the second wafer using a laser.

3. The method as claimed in claim 1, wherein expanding the width of the preliminary alignment hole includes wet etching an inner surface of the preliminary alignment hole.

4. The method as claimed in claim 1, wherein forming the alignment hole includes forming the alignment hole at an edge portion of the second wafer.

5. The method as claimed in claim 1, wherein forming the alignment hole includes forming at least two alignment holes in the second wafer.

6. The method as claimed in claim 1, wherein aligning the first alignment key and the second alignment key with each other includes:
    photographing the first alignment key and the second alignment key through the alignment hole to obtain an image; and
    moving the first wafer and/or the second wafer to position the first alignment key and the second alignment key at a same vertical line based on the image.

7. A method of bonding wafers, the method comprising:
    arranging a second wafer having at least one second alignment key over a first wafer having at least one first alignment key;
    forming at least one alignment hole by passing through the second wafer to expose the second alignment key and the first alignment key;
    aligning the first wafer and the second wafer with each other using the first alignment key and the second alignment key exposed through the alignment hole; and
    bonding the first wafer and the second wafer to each other, wherein:
    the first alignment key includes two or more first alignment keys,
    the second alignment key includes two or more second alignment keys, and
    forming the alignment hole includes forming at least two alignment holes at an edge portion of the second wafer, and
    wherein forming each of the two alignment holes includes:
    forming at least two preliminary alignment holes by passing through the edge portion of the second wafer to expose side surfaces of at least two second alignment keys and upper surfaces of at least two first alignment keys; and expanding a width of each of the two preliminary alignment holes to form each of the two alignment holes to expose an upper surface of each of the two or more second alignment keys.

8. The method as claimed in claim 7, further comprising removing the edge portion of the second wafer after bonding the first and second wafer to each other.

9. The method as claimed in claim 8, wherein removing the edge portion of the second wafer includes removing the two or more second alignment keys.

10. The method as claimed in claim 8, further comprising partially removing backsides of the first and second wafers.

11. The method as claimed in claim 7, wherein aligning the first alignment key and the second alignment key with each other includes:

photographing the first alignment key and the second alignment key through the alignment hole to obtain an image; and moving the first wafer and/or the second wafer to position the first alignment key and the second alignment key at a same vertical line based on the image.

* * * * *